United States Patent [19]

Sharma et al.

[11] Patent Number: 5,585,293

[45] Date of Patent: Dec. 17, 1996

[54] FABRICATION PROCESS FOR A 1-TRANSISTOR EEPROM MEMORY DEVICE CAPABLE OF LOW-VOLTAGE OPERATION

[75] Inventors: Umesh Sharma; Kuo-Tung Chang, both of Austin, Tex.

[73] Assignee: Motorola Inc., Schaumburg, Ill.

[21] Appl. No.: 446,133

[22] Filed: May 22, 1995

Related U.S. Application Data

[62] Division of Ser. No. 254,083, Jun. 3, 1994, abandoned.

[51] Int. Cl.$^6$ ............................................. H01L 21/8247
[52] U.S. Cl. ........................ 437/43; 437/44; 437/52; 257/316; 257/318
[58] Field of Search ..................... 437/43, 52, 44; 257/316, 318

[56] References Cited

U.S. PATENT DOCUMENTS

| | | | |
|---|---|---|---|
| 5,020,030 | 5/1991 | Huber | 365/185 |
| 5,051,793 | 9/1991 | Wang | 357/23.5 |
| 5,063,172 | 11/1991 | Manley | 437/43 |
| 5,073,513 | 12/1991 | Lee | 437/43 |
| 5,077,691 | 12/1991 | Haddad | 365/185 |
| 5,130,769 | 7/1992 | Kuo et al. | 357/23.5 |
| 5,225,362 | 7/1993 | Bergemont | 437/43 |
| 5,280,446 | 1/1994 | Ma et al. | 365/185 |
| 5,408,115 | 4/1995 | Chang | 257/324 |
| 5,494,838 | 2/1996 | Chang et al. | 437/43 |

OTHER PUBLICATIONS

T. Y. Chan et al., "A True Single–Transistor Oxide–Nitride–Oxide EEPROM Device", IEEE EDL–8, No. 3, Mar. 1987, pp. 93–95.
A. T. Wu et al., "A Novel High Speed 5–Volt Programming EPROM Structure with Source–Side Injection", IEDM 1986, pp. 584–587, no month provided.
K. Naruke, et al., "A New Flash–Erase EEPROM Cell with a Sidewall Select–Gate on its Source Side", IEDM 1989, pp. 603–606, no month provided.
Y. Yamauchi, et al., "A 5V–only Virtual Ground Flash Cell with an Auxiliary Gate for High Density and High Speed Application", IEDM 1991, pp. 319–322, no month provided.
A. T. Wu, "A Novel High–Speed,5–Volt Programming EPROM Structure", '86 IEEE, pp. 584–587, 1986, no month provided.
Takaaki Nozaki et al., 1990 Symposium on VLSI Circuits, "A 1 Mbit EEPROM with MONOS memory cell for semiconductor disk application", pp. 101–102, no month provided.

*Primary Examiner*—John Niebling
*Assistant Examiner*—Michael S. Lebentritt

[57] ABSTRACT

A method for fabricating a 1-transistor EEPROM device, which can be programmed and erased by Fowler-Nordheim tunneling includes the formation of a memory gate (28) overlying a tunneling region (22), and aligning source (32) and drain (34) regions in a semiconductor substrate (10), such that a vertically oriented electric field (46) is created in the tunneling region (22). The memory gate (28) is coupled to a contact region (30) by a connecting portion (31). A select gate (14) controls a portion of the channel region in the substrate (10) adjacent to the tunneling region (22). The EEPROM device is programmed by applying a voltage of a first polarity memory gate (28), while applying a voltage of a second polarity to the source region (32), the drain region (34), and to the substrate (10). Under the applied voltages, charge carriers tunnel through a tunnel oxide layer (40) and into a silicon nitride layer (42), located intermediate to the memory gate (28) and the tunnel region (22). To erase the EEPROM device, the polarity of the applied voltages is reversed, and charge carriers of an opposite conductivity type tunnel into the silicon nitride layer (42).

7 Claims, 3 Drawing Sheets

FABRICATION PROCESS FOR A 1-TRANSISTOR EEPROM MEMORY DEVICE CAPABLE OF LOW-VOLTAGE OPERATION

RELATED APPLICATIONS

This is a divisional of application Ser. No. 08/254,083, filed Jun. 3, 1994 and now abandoned.

This application is related to subject matter disclosed in commonly assigned, patent applications having Ser. No. 08/223,354, now U.S. Pat. No. 5,467,308 and Ser. No. 08/223,395 now U.S. Pat. No. 5,408,115.

FIELD OF THE INVENTION

This invention relates in general to a method for fabricating a nonvolatile semiconductor devices, and more particularly to a method for fabricating a 1-transistor EEPROM device which can be programmed and erased at low voltages.

BACKGROUND OF THE INVENTION

State of the art non-volatile memory devices are typically constructed by fabricating a field effect transistor in a silicon substrate. The field effect transistor is capable of storing electrical charge either in a separate gate electrode, known as a floating gate, or in a dielectric layer underlying a control gate electrode. Data is stored in a non-volatile memory device by changing the threshold voltage of the field effect transistor through the storage of electrical charge over the channel region of the substrate. For example, in an n-channel enhancement device, an accumulation of electrons in a floating gate electrode, or in a dielectric layer overlying the channel region, creates a high threshold voltage in the field effect transistor. When the control gate is grounded, current will not flow through the transistor, which is defined as a logic 0 state. Conversely, a reduction in the negative charge over the channel region creates a low threshold voltage, possibly negative. In this condition, with the control gate grounded, current will flow through the field effect transistor, which is defined as a logic 1 state.

One particular type of non-volatile memory device is the flash EEPROM (electrically-erasable-programmable-read-only-memory). Flash EEPROMs are a type of device which provide electrical erasing capability. The term "flash" refers to the ability to erase the memory cells simultaneously with electrical pulses. In an erased state, the threshold voltage of the field effect transistor is low and electrical current can flow through the transistor indicating a logic 1 state.

To program an EEPROM cell, typically, drain-side hot-electron injection is used to inject electrons onto either a floating gate electrode, or into trapping sites in a dielectric film overlying the channel region. The injection current can be enhanced by increasing either the channel electric field, or the electric field in the dielectric layer. To reduce the amount of time necessary to complete a programming operation, very high drain and gate voltages are used, such that the transistor is operating very close to breakdown during programming. However, the high voltages necessary for drain-side injection require that an additional power supply be provided to supply voltage levels in excess of the standard 5-volt operating voltage.

To reduce the current consumption necessary to program an EPROM cell, EEPROM devices have been developed which can be programmed and erased by Fowler-Nordheim tunneling. A thin tunnel oxide window is positioned in the gate dielectric near the source or drain region. To program the device, the gate is pulled to a high-voltage level, while the source, drain and substrate are held at ground potential. The high electric field generated across the thin tunnel oxide causes a tunneling current to flow, which charges the floating gate with electrons. Both hot carrier injection and Fowler-Nordheim programmable devices typically require a separate high-voltage power supply to provide voltage levels necessary for programming and erasing the cells.

A second type of memory device is known in the art as a SONOS (silicon-oxide-nitride-oxide-silicon) EEPROM device. The SONOS memory device consists of a single transistor which has a memory gate electrode disposed on an ONO (oxide-nitride-oxide) layer. A charge is stored in discrete traps in the bulk of the silicon nitride layer. The SONOS device is programmed by tunneling charge through a thin tunnel oxide layer from the substrate into the silicon nitride layer. Although SONOS devices offer the potential for low-voltage operation, further development is necessary to provide SONOS devices suitable for high-density integrated circuits.

SUMMARY OF THE INVENTION

In practicing the present invention there is provided a method for fabricating an EEPROM device and a method for performing data operations in an EEPROM memory array, which incorporates EEPROM devices fabricated in accordance with the invention. In one embodiment of the invention, a select gate electrode is formed on a semiconductor substrate. The select gate electrode has first and second edges and defines a first channel region in the semiconductor substrate. An N- extension region is formed in the substrate using the first edge of the select gate electrode as a doping mask. Insulating sidewall spacers are formed adjacent to the first and second edges of the select gate electrode, and an ONO layer is formed to overlie a second channel region in the substrate and the select gate electrode. The ONO layer is separated from the select gate electrode by the sidewall spacer adjacent to the second edge of the select gate electrode. A memory gate electrode is formed adjacent to the second edge of the select gate electrode, and separated from the second channel region by the ONO layer. Finally, the substrate is doped to form a source region aligned to the insulating sidewall spacer adjacent to the first edge of the select gate electrode, and a drain region aligned to the memory gate electrode. Accordingly, the drain region is spaced apart from the source region by the first and second channel regions.

The doping levels in the substrate and the construction of the ONO layer are implemented to create a vertically oriented electric field in the second channel region by applying a voltage of a first polarity to the gate extension, while applying a voltage of a second polarity to the source and drain regions, and to the substrate. The vertically oriented electric field impinges on the ONO layer along the entire length of the second channel region. Under the applied voltages, the EEPROM device is programmed by tunneling charge into the ONO layer under the influence of the vertically oriented electric field. By reversing the polarity of the applied voltage, the EEPROM device is erased by tunneling charge from the ONO layer into the underlying substrate.

Figure 1:
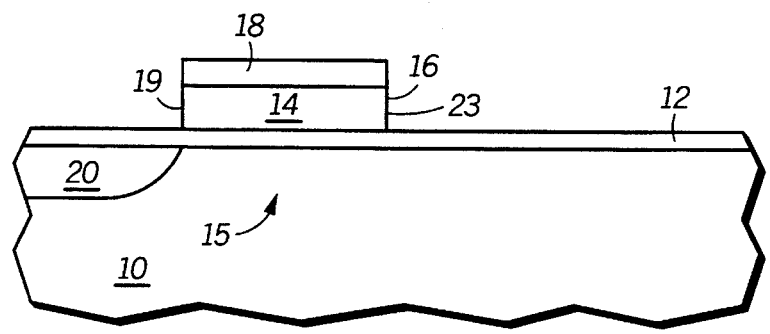
FIGS. 1–3 and 6 illustrate, in cross-section, process steps for the fabrication of an EEPROM device in accordance with the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The EEPROM device and process of the present invention provides a compact, 1-transistor memory cell, which can be programmed and erased using a single, low-voltage power supply. Additionally, charge is transferred to an ONO layer by applying a voltage of a first polarity to the memory gate electrode, while applying a voltage of a second polarity to the remaining electrodes in the cell. Data can be read from a memory cell fabricated in accordance with the invention, by applying a single, low-voltage to a select gate electrode, while grounding the substrate and the remaining electrodes in the cell. The programming current is sufficiently small, such that a single, low-voltage power supply can be used to operate the cell. Furthermore, the compact arrangement of cell components reduces the amount of substrate surface area required to fabricate the EEPROM device of the invention.

The low programming current of the memory cell is made possible by a compact arrangement of cell components. Fowler-Nordheim tunneling is used to both program and erase the memory cell. To enhance the efficiency of the Fowler-Nordheim tunneling process, electrical charge is stored in a silicon nitride layer, which is separated from the substrate surface by a thin tunnel oxide layer. Because the tunnel oxide layer is very thin, on the order of tens of angstroms, a high electric field is created and charge carriers readily tunnel through the oxide layer. The transfer of charge to the silicon nitride layer is further enhanced by the creation of a uniform, vertical electric field in the substrate. The charge is uniformly injected along the entire length of the silicon nitride layer overlying the charge injection region of the substrate. In addition to enhanced programming and erasing capability, the ability to operate the memory cell with a single low voltage power supply improves the immunity of memory cells to disturbance conditions arising from data operations in other memory cells within an EEPROM array.

Figure 6:
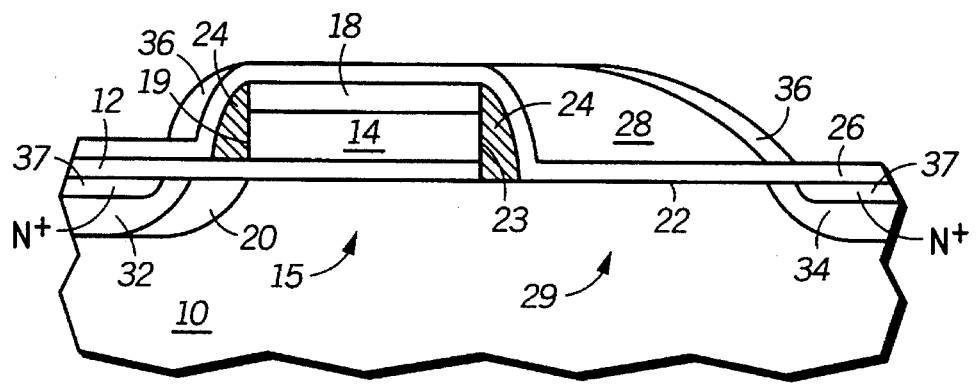
Figure 7:
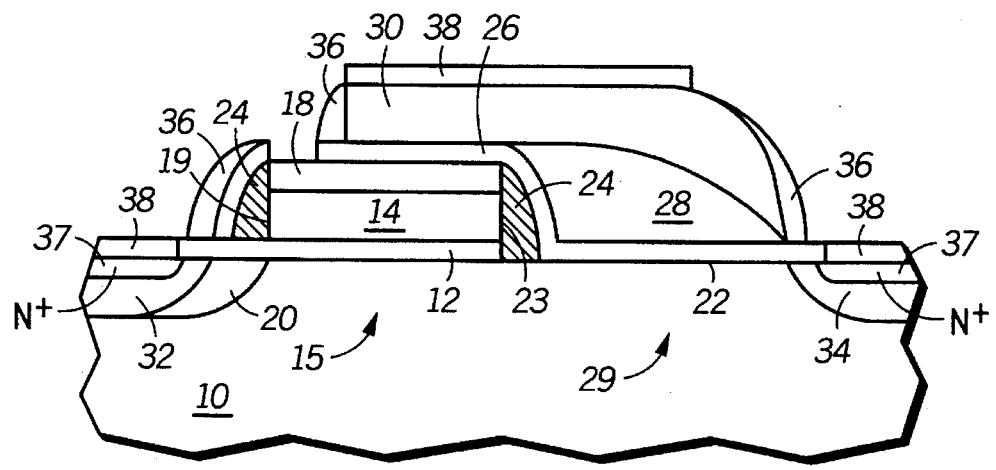
FIG. 7 illustrates, in cross-section, the EEPROM device of the invention having optional metal silicide regions.
Figure 8:
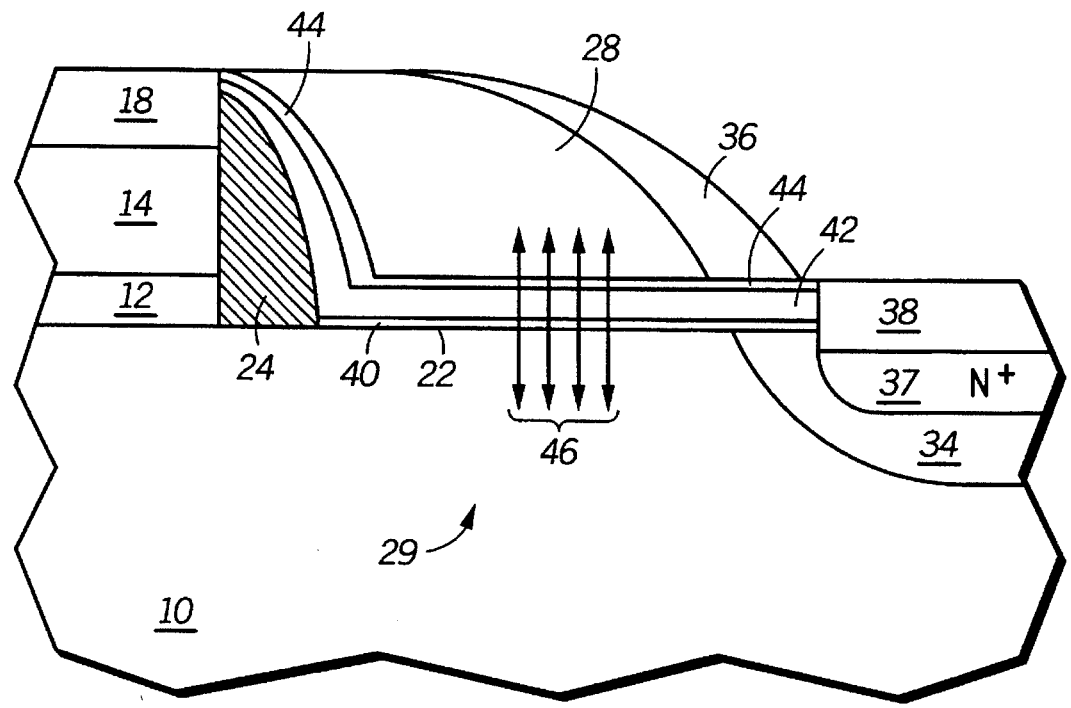
FIG. 8 illustrates, in cross-section, an exploded view of a portion of the EEPROM device illustrated in FIG. 6.
Figure 9:
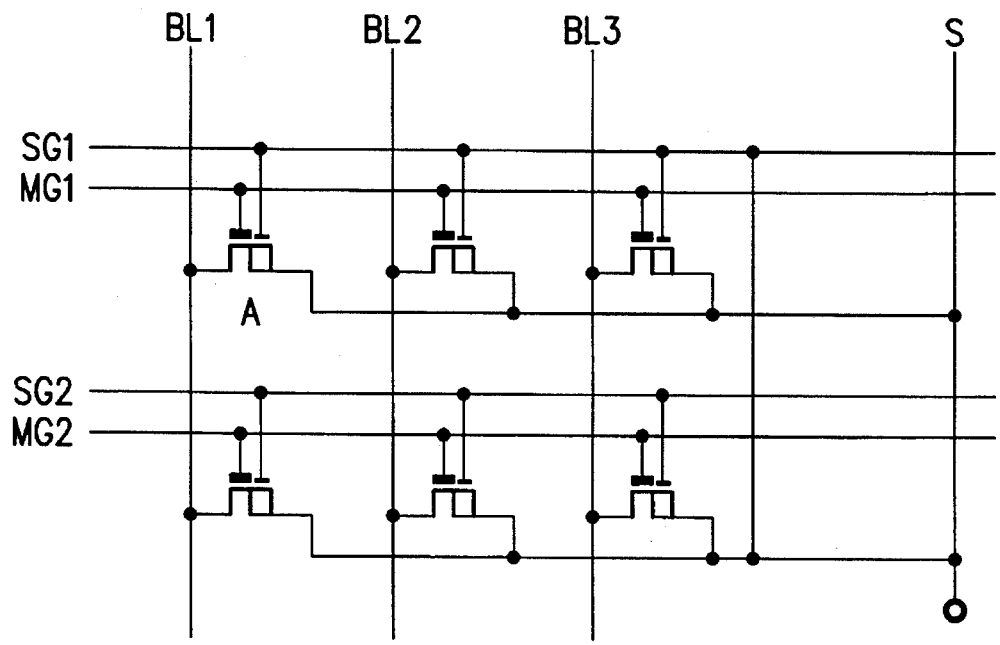
FIG. 9 is a schematic diagram of an EEPROM array illustrating a plurality of memory cells having EEPROM devices fabricated in accordance with the invention.

FIGS. 1–3 and 6–7, illustrate, in cross-section, process steps in accordance with one embodiment of the invention for the fabrication of a 1-transistor EEPROM device capable of low voltage operation. FIG. 8 is a schematic diagram of an EEPROM memory array showing one possible arrangement of memory cells fabricated in accordance with the invention. The compact cell structure of the memory cells illustrated in FIG. 8, can be better understood following a description of a fabrication process in accordance with one embodiment of the invention.

In the following description, the fabrication of an EEPROM device will be described in the context of the structure and function of an N-channel EEPROM cell and array. Accordingly, semiconductor substrate 10 is predominately of P-type conductivity with N-type regions therein forming the source and drain regions. Those skilled in the art will recognize that while this is, by far, the most common choice for EEPROM devices, it is also possible to reverse the conductivity and fabricate a P-channel EEPROM array.

Shown in FIG. 1, in cross-section, is a portion of a semiconductor substrate 10 having already undergone several process steps in accordance with the invention. A gate dielectric layer 12 overlies the surface of substrate 10 and separates a select gate electrode 14 from substrate 10. Gate dielectric 12 is preferably a thermally grown silicon dioxide layer. Select gate electrode 14 includes a semiconductor body 16 and an insulating cap 18. Semiconductor body 16 is preferably a layer of polycrystalline silicon deposited by chemical vapor deposition. Alternatively, semiconductor body 16 can be a refractory metal silicide, such as tungsten silicide, and the like. Semiconductor body 16 is doped to have an N-type conductivity by introducing dopants either during the chemical vapor deposition process, or immediately afterwards.

Following the deposition of polycrystalline silicon layer 16, an insulating layer is deposited to overlie the polycrystalline silicon layer. Preferably, insulating layer is silicon dioxide deposited by chemical vapor deposition using tetraethylorthosilane (TEOS) source gas. The insulating layer and the underlying polycrystalline silicon layer are then anisotropically etched to form select gate electrode 14. A sequential etching process is used to selectively etch the silicon dioxide layer using fluorinated etching gases, followed by selective etching of the polycrystalline silicon layer using chlorinated etching gases. Select gate electrode 14 defines a first channel region 15 in substrate 10 underlying the select gate electrode. Next, a photolithographic mask is formed over a portion of substrate 10, and a doping process is carried out to form an N- extension region 20 in substrate 10. The N- extension region is aligned to a first edge 19 of select gate electrode 14.

Figure 2:
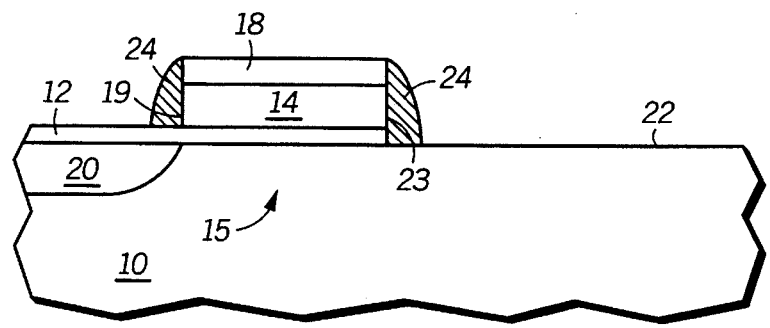

After forming N- extension region 20, a portion of dielectric layer 12 is removed to expose a tunneling region 22 at the surface of substrate 10, as illustrated in FIG. 2. Tunneling region 22 extends along the surface of substrate 10 to a second edge 23 of select gate electrode 14. Then, insulating sidewall spacers 24 are formed adjacent to the first and second edges 19 and 23, of select gate electrode 14. Preferably, insulating sidewall spacers 24 are formed by the chemical vapor deposition of silicon dioxide, using TEOS source gas, followed by anisotropically etching the silicon dioxide. A reactive ion etching process, for example, using fluorinated etching gas, can be employed to directionally etch the silicon dioxide. The anisotropic etching process leaves sidewall spacers at the vertical surfaces adjacent to the select gate electrode. Alternatively, sidewall spcaers 24 can be formed prior to removing the portion of dielectric layer 20. In this case, the substrate surface is not exposed to the etchant used to form the sidewall spacers.

Figure 3:
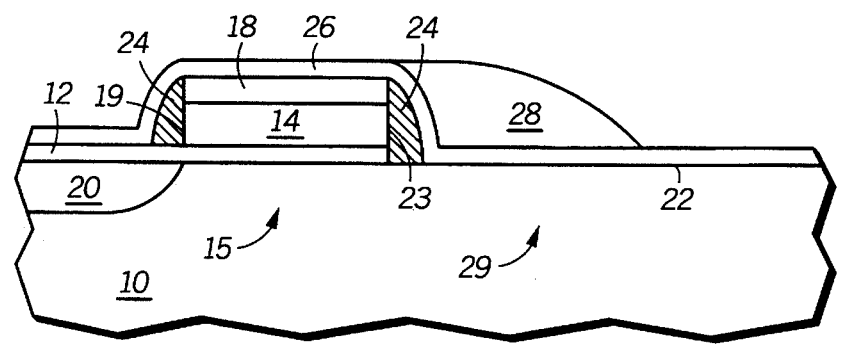

After forming insulating sidewall spacers 24, an ONO layer 26 is formed to overlie substrate 10, including dielectric layer 12, select gate electrode 14, and tunnel region 22, as illustrated in FIG. 3. ONO layer 26 is preferably formed by oxidizing substrate 10 to form a first silicon dioxide layer, followed by the chemical vapor deposition of a layer of silicon nitride. Finally, a second layer of silicon dioxide is chemical vapor deposited to overlie the silicon nitride layer. The detailed construction of ONO layer 26 will be more fully described in the subsequent description of the charge transfer characteristics of the EEPROM device.

Once ONO layer 26 is formed, a memory gate electrode 28 is formed adjacent to second edge 23 of select gate electrode 14, and is separated from the select gate electrode by insulating sidewall spacer 24, and by ONO layer 26. Preferably, memory gate electrode 28 is formed by the chemical vapor deposition and anisotropic etching of a polycrystalline silicon layer. The polycrystalline silicon layer is doped to have an N-type conductivity by either including N-type dopants during the deposition process, or by depositing the polycrystalline silicon as an undoped layer, and subsequently doping the deposited polycrystalline silicon. The directional nature of the anisotropic etching process forms a sidewall spacers adjacent to edge 23. Following the etching process, a photolithographic mask (not shown) is formed over one side of select gate electrode 14, and exposed portions of the sidewall spacers are removed by means of isotropic etching.

Memory gate electrode 28 defines a second channel region 29 in substrate 10 underlying gate extension 30 and adjacent to first channel region 15. In one embodiment of the invention, second channel region 29 is approximately the same length as first channel region 15. Accordingly, the lateral dimension of memory gate electrode 28, at the surface of substrate 10, is approximately the same as select gate electrode 14. The thickness of the polycrystalline silicon layer used to form memory gate electrode 28 will determine the lateral dimension of memory gate electrode 14. Therefore, the deposition thickness of the polycrystalline silicon layer is selected to provide a sidewall spacer having the appropriate lateral dimensions upon completion of the anisotropic etching process.

Figure 4:
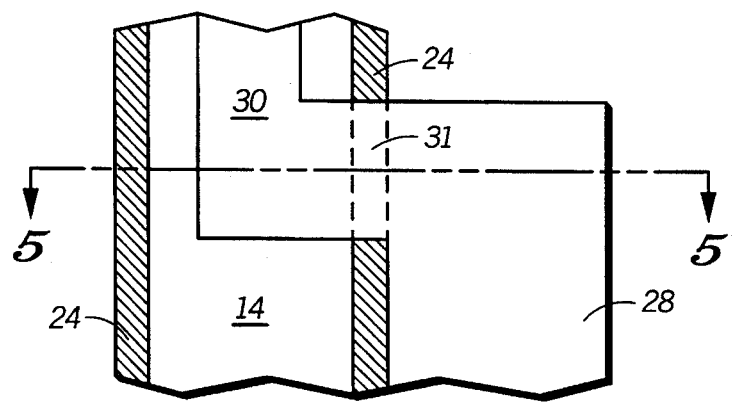
FIG. 4 is a top view of a portion of an EEPROM device formed in accordance with the invention.

In an EEPROM memory array formed in accordance with the invention, the select gate electrodes are formed as stripes of polycrystalline silicon overlying the surface of substrate 10. The memory gate electrodes also overlie the surface of substrate 10, and are disposed parallel to select gate electrodes. Gate voltage is coupled to the memory gates in the array by extending a portion of the memory gate electrode onto the upper surface of select gate electrodes at the end of the array. FIG. 4 illustrates a top view of a portion of select gate electrode 14 and memory gate electrode 28 at the end of the memory array. A contact region 30 is connected to memory gate electrode 28 by a connecting portion 31. Connecting portion 31 overlies a portion of sidewall spacer 24 and extends over select gate electrode 14. Each column of the memory array includes the gate extension and contact region illustrated in FIG. 4.

To fabricate contact region 30 and extension 31, a photolithographic mask is formed on the polycrystalline silicon layer prior to the anisotropic etching process used to form memory gate electrode 28. The photolithographic mask (not shown) includes an open region in the vicinity of second edge 23 of select gate electrode 14 and located in the central portion of the array. The directional nature of the anisotropic etching process transfers a nearly exact replica of the photolithographic pattern into the polycrystalline silicon layer. However, in the open regions, the directional etch forms a sidewall spacers (gate electrode 28) adjacent to edges 19 and 23 of select gate electrode 14.

Figure 5:
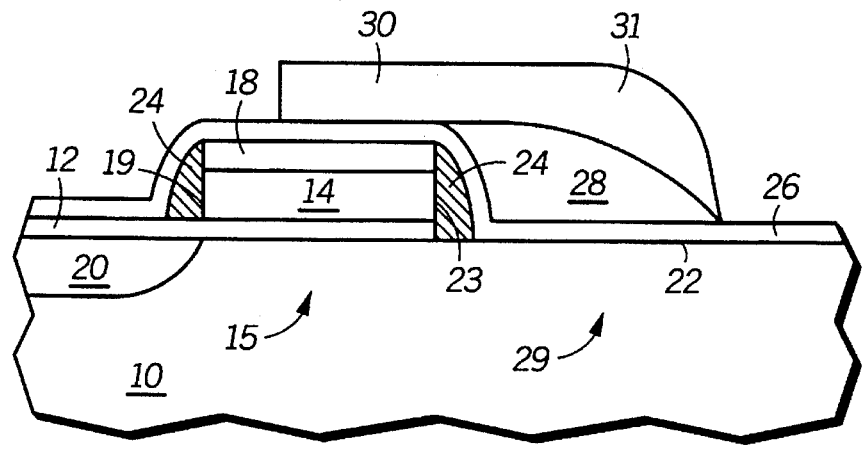
FIG. 5 is a cross sectional view of the device illustrated in FIG. 4, taken along the section line 5—5.

A cross section of the EEPROM device taken along section line 5-5 of FIG. 4 is illustrated in FIG. 5. While the contact region and extension illustrated in FIGS. 4 and 5 depict one embodiment of the invention, those skilled in the art will recognize that many different geometric patterns can be used to form contact region 30 and extension 31.

The process of the invention continues with the formation of N- source and drain regions 32 and 34, respectively, as illustrated in FIG. 6. Preferably, N- source and drain regions 32 and 34 are formed by the ion implantation of phosphorus or arsenic into substrate 10. The ion implantation process is carried out such that N- source region 32 is aligned to the edge of first insulating sidewall spacer 24 adjacent to edge 19 of select gate electrode 14. N- drain region 34 is aligned to the edge of memory gate electrode 28. In one embodiment of the invention, the existing structures in each memory cell overlying the surface of substrate 10 can be used as doping masks to align the N- source and drain regions to the edges of sidewall spacers and the gate extensions. N- source region 32 is electrically coupled to the channel region of the substrate underlying select gate electrode 14 by N- extension 20. Also, implanting the substrate using gate electrode 28 as a doping mask aligns N- drain region 34 to the edge of second channel region 29. Accordingly, following the ion implant process, drain region 34 is separated from N- extension 20 by first channel region 15 and second channel region 29.

After forming N- source and drain regions 32 and 34, second insulating sidewall spacers 36 are formed adjacent to memory gate electrode 28, and adjacent to first edge 19 of select gate electrode 14. Then, an ion implantation process is performed to form N+ source and drain regions 37. As shown in FIG. 6, N+ source and drain regions 37 are aligned to second insulating sidewall spacers 36.

In the foregoing description, processing steps are described for the fabrication of the functional components of an EEPROM memory cell in accordance with one embodiment of the invention. Although an EEPROM device fabricated in accordance with the foregoing description can be used to fully realize the advantages of the invention, optional processing steps can be used to enhance certain aspects of the invention. For example, in accordance with a further embodiment of the invention, a layer of metal silicide 38 is formed on the upper surface of contact region 30, and the surface of substrate 10 overlying source and drain regions 32 and 34. Metal silicide regions 38 are illustrated in FIG. 7.

To form silicide region 38, portions of ONO layer 26 and dielectric layer 12 are removed to expose the surface of substrate 10. In one embodiment, a refractory metal, such as titanium, is deposited to overlie the surface of the entire structure. A subsequent thermal annealing process, for example, 60 seconds at about 650° C., causes the formation of titanium silicide where the titanium metal is in contact with the silicon surfaces of memory gate electrode 28 and substrate 10. No silicide forms in those regions where titanium metal overlies an oxide or other dielectric material. The remaining titanium is removed by etching an ammonium hydroxide and hydrogen peroxide which removes the titanium metal, but leaves the titanium silicide unaffected. The silicide formed on the upper surface of memory gate electrode 28 is physically and electrically separated from the silicide layers overlying the source and drain regions. The formation of a refractory metal silicide reduces the electrical resistance in metallized contacts formed in each memory cell.

An exploded view of a portion of the EEPROM device of the present invention is illustrated in FIG. 8. ONO layer 26 includes a tunnel oxide layer 40 overlying the surface of tunnel region 22, and a second silicon dioxide layer 44 overlying a silicon nitride layer 42. Preferably, tunnel oxide layer 40 is grown to a thickness of about 10 to 20 angstroms. During programming, electrons tunnel through tunnel oxide layer 44 and are stored in silicon nitride layer 42. By applying a positive voltage to gate extension 30, while applying negative voltages to source region and drain regions 32 and 34, select gate electrode 14, and substrate 10, a vertically oriented electric field 46 is created in tunnel region 22. The application of the positive and negative voltages creates a uniform, vertically-oriented electric field impinging on silicon nitride layer 42 along the entire length of channel region 22. The relatively small thickness of tunnel oxide layer 40 enables a high electric field to be generated across the tunnel oxide layer at relatively low voltage levels.

The ability to transfer charge to and from silicon nitride layer 42 at low voltages enables the memory cells to be operated from a single, low-voltage power supply. For example, a power supply operating at 1 to 3 volts can supply programming voltages sufficient to transfer charge to silicon nitride layer 42. Data is erased from the memory cells by tunneling positive charge to silicon nitride layer 42, again at relatively low voltage.

Also, because Fowler-Nordheim tunneling is used to program the memory cell, the programming current is very small. In one embodiment of the invention, the programming current is on the order of tens of nanoamps for a single bit cell. The small programming current enables the use of on-chip charge pump circuitry to operate the array.

An EEPROM memory array containing a plurality of memory cells formed in accordance with the invention is illustrated in FIG. 8. The operating voltages for a selected cell A are shown in Table I.

TABLE I

|       | SG1  | SG2  | MG1  | MG2  | BL1  | BL2  | BL3  | S    |
|-------|------|------|------|------|------|------|------|------|
| WRITE | −3.3 | −3.3 | 5.0  | −3.3 | −3.3 | 3.3  | 3.3  | −3.3 |
| ERASE | −3.3 | −3.3 | −3.3 | 5.0  | 5.0  | 5.0  | 5.0  | 5.0  |
| READ  | 1.8  | 0    | 0    | 0    | SA   | OPEN | OPEN | 0    |

Cell A is programmed by applying 5.0 volts to memory gate line 1 (MG1), while applying a negative 3.3 volts to select gate 1 (SG1), bit-line 1 (BL1), to the substrate, and to common source region (S). Under the applied voltage differential, electrons tunnel into silicon nitride layer 42 increasing the threshold voltage of the enhancement transistor and placing cell A in a logic "0" state. During programming of cell A, bit-line 2 and bit-line 3 are maintained at positive 3.3 volts. Accordingly, the cells in the same row as cell A do not experience a voltage differential sufficient to transport charge in the adjacent cells. Cells in the same column as cell A have a negative 3.3 volts applied to their memory gates. The low programming voltage minimizes gate disturbance conditions in memory cells sharing MG1 with cell A.

Data is read from selected cell A by applying 1.8 volts to SG1 while grounding MG1, and the source. During a read operation, a sense amplifier connected to BL1 detects the presence, or absence, of current flow through cell A. The sense amplifier is gated off (OPEN) to cells along BL2 and BL3, while reading cell A. The relatively low read voltage avoids inadvertent programming of memory cells located in the same column as cell A.

To erase cell A, positive 5.0 volts is applied to bit-line 1, the source, and the substrate, while MG1 and SG1 are maintained at negative 3.3 volts. The potential difference between the substrate and the memory gate electrode causes positive charge to tunnel through first silicon dioxide layer 40 and into silicon nitride layer 42. Erase disturbance conditions are minimized by the small voltage difference across the tunnel oxide layers in adjacent memory cells.

While the operation of the 1-transistor EEPROM device of the invention has been described with reference to specific voltages, those skilled in the art will appreciate that other voltages can be used. The programming and erase voltages used herein are merely exemplary of voltages commonly available from voltage supplies used in many integrated circuit devices.

Thus it is apparent that there has been provided, in accordance with the invention, a method for fabricating a 1-transistor EEPROM device, and a method for performing data operations in an EEPROM memory array, which fully meet the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, multi-chambered deposition and etching equipment can be used to deposit composite layers, such as the ONO layer, and to prepare exposed surfaces of the substrate for thin-film deposition. Further, other methods of imparting dopant atoms to the substrate and to deposited layer, such as molecular beam epitaxy, and the like, can be employed. Additionally, other etching techniques, such as electron cyclotron resonance etching can be used. It is therefore intended to include within the invention all such variations and modifications as fall within the scope of the appended claims and equivalents thereof.

We claim:

1. A method for fabricating an EEPROM device comprising the steps of:

providing a substrate having a surface and a gate dielectric layer overlying the surface;

forming a select gate electrode on the gate dielectric layer, the select gate electrode having first and second edges and defining a first channel region in the substrate;

removing a portion of the gate dielectric layer adjacent to the second edge of the select gate electrode to expose a tunnel region at the substrate surface;

forming insulating sidewall spacers adjacent to the first and second edges of the select gate electrode respectively;

forming an ONO layer to overlie the tunnel region and the select gate electrode;

forming a memory gate electrode adjacent to the second edge of the select gate electrode and separated from the tunnel region by the ONO layer; and doping the substrate to form source and drain regions using the insulating sidewall spacer adjacent to the first edge of the select gate electrode and the memory gate electrode as a doping mask, wherein the memory gate electrode defines a second channel region in the substrate adjacent to the first channel region.

2. The method of claim 1, wherein the step of doping the substrate defines the length of the second channel region, such that the length of the second channel region is equal to the length of the first channel region.

3. The method of claim 1, wherein the step of forming a memory gate electrode comprises the steps of:

depositing a layer of polycrystalline silicon;

forming a photolithographic pattern to define a contact region overlying a portion of the select gate electrode; and anisotropically etching the polycrystalline silicon layer to form the memory gate electrode and to form a contact region overlying a portion of the select gate electrode.

4. A method for fabricating an EEPROM device comprising the steps of:

forming a select gate electrode on a semiconductor substrate, the select gate electrode having first and second edges and defining a first channel region in the substrate;

forming an N- extension region in the substrate using the first edge of the select gate electrode as a doping mask;

forming insulating sidewall spacers adjacent to the first and second edges of the select gate electrode respectively;

forming an ONO layer to overlie a second channel region in the substrate and the select gate electrode, wherein the ONO layer is separated from the select gate electrode by the sidewall spacer adjacent to the second edge of the select gate electrode;

forming a memory gate electrode adjacent to the second edge of the select gate electrode and separated from the second channel region by the ONO layer; and doping the substrate to form a source region aligned to the insulating sidewall spacer adjacent to the first edge of the select gate electrode, and a drain region aligned to the gate extension and spaced apart from the source region by the first and second channel regions and the N- extension region, such that a vertically oriented electric field is created in the second channel region by applying a voltage of a first polarity to the gate extension, while applying a voltage of a second polarity to the source and drain regions, and to the substrate.

5. The method of claim 4, further comprising forming a titanium silicide layer in the substrate overlying the source and drain regions, and on an upper surface of the memory gate electrode.

6. The method of claim 4, wherein the step of forming an ONO layer comprises the step of:

growing a tunnel oxide layer on the surface of the second channel region;

depositing a silicon nitride layer to overlie the tunnel oxide layer; and depositing a layer of silicon dioxide to overlie the silicon nitride layer.

7. The method of claim 4 further comprising forming second insulating sidewall spacers adjacent to the memory gate electrode and the gate extension.

* * * * *